(12) United States Patent
Kim et al.

(10) Patent No.: US 11,444,606 B2
(45) Date of Patent: Sep. 13, 2022

(54) SPIKE PULSE GENERATION CIRCUIT COMPRISING SINGLE SILICON DEVICE

(71) Applicant: Korea University Research and Business Foundation, Seoul (KR)

(72) Inventors: Sang Sig Kim, Seoul (KR); Kyoung Ah Cho, Seoul (KR); Doo Hyeok Lim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/168,395

(22) Filed: Feb. 5, 2021

(65) Prior Publication Data
US 2022/0006448 A1   Jan. 6, 2022

(30) Foreign Application Priority Data
Jul. 1, 2020 (KR) .................. 10-2020-0081116

(51) Int. Cl.
*H03K 3/03* (2006.01)
*H01L 23/00* (2006.01)

(52) U.S. Cl.
CPC .......... *H03K 3/0315* (2013.01); *H01L 23/00* (2013.01)

(58) Field of Classification Search
CPC ................................................. H03K 3/0315
USPC ........................................................ 257/183
See application file for complete search history.

(56) References Cited

U.S. PATENT DOCUMENTS

2021/0056398 A1* 2/2021 Kim .................. G06N 3/063
2021/0150320 A1* 5/2021 Kim .................. H03K 17/72

FOREIGN PATENT DOCUMENTS

KR   10-2017-0138047 A   12/2017
KR   10-2018-0127153 A   11/2018

OTHER PUBLICATIONS

Cauwenberghs, Gert. "An Analog VLSI Recurrent Neural Network Learning a Continuous-Time Trajectory," *IEEE Transactions on Neural Networks*, vol. 7, No. 2, Mar. 1996 (pp. 346-361).
Vardhana, M., et al. "Convolutional neural network for bio-medical image segmentation with hardware acceleration," *Cognitive Systems Research*, 50, 2018 (pp. 10-14).

* cited by examiner

*Primary Examiner* — Ajay Arora
(74) *Attorney, Agent, or Firm* — NSIP Law

(57) ABSTRACT

Provided is a spike pulse generation circuit comprising a single silicon device configured to non-periodically or periodically generate a spike pulse. More particularly, the spike pulse generation circuit comprising the single silicon device can utilize a positive feedback loop and a negative feedback loop to be mutually connected so as to selectively output a spike pulse related to a neural oscillation function similar to biological oscillation, thereby being capable of serving as a ring oscillator and performing a neuron function operation.

11 Claims, 25 Drawing Sheets

410

420

SPIKE PULSE GENERATION CIRCUIT COMPRISING SINGLE SILICON DEVICE

CROSS-REFERENCE TO RELATED APPLICATION

This application claims priority to Korean Patent Application No. 10-2020-0081116, filed on Jul. 1, 2020 in the Korean Intellectual Property Office, the disclosure of which is incorporated herein by reference.

BACKGROUND OF THE DISCLOSURE

Field of the Disclosure

The Present Disclosure

The present disclosure relates to a spike pulse generation circuit comprising a single silicon device configured to non-periodically or periodically generate a spike pulse, and more particularly to a spike pulse generation circuit comprising a single silicon device configured to utilize a positive feedback loop and a negative feedback loop to be mutually connected so as to selectively output a spike pulse related to a neural oscillation function similar to biological oscillation, thereby being capable of serving as a ring oscillator and performing a neuron function operation.

Description of the Related Art

Due to the explosion of data generated by Internet of Things in the fourth industry, existing von Neumann computing faces physical limitations with regard to data processing.

In other words, exiting von Neumann-based computers exhibit a high operation speed in sequential mathematical calculations, but exhibit limitations in terms of speed and power consumption in calculating simultaneous inputs and outputs.

In addition, continuous expansion of Complementary Metal Oxide Semiconductor (CMOS) technology is no longer possible.

Accordingly, there is a need for neuromorphic computing as a new computing paradigm to process large amounts of data.

With increasing interest in artificial neural networks, the development of electronic devices that mimic the behavior of biological neurons and brains, such as Convolutional Neural Networks (CNNs), Recurrent Neural Networks (RNNs) and Spiking Neural Networks (SNNs) is being accelerated.

Among various neuromorphic technologies, the spiking neural network technology can implement more sophisticated thinking skills by imitating the actions of neural networks and brain waves in the brain.

To implement such a spiking neural network, neurons and synapses should be implemented in the form of electronic devices. In particular, studies are being conducted all over the world to implement synapses, responsible for brain memory and learning, in the form of electronic devices.

Synaptic-mimicking devices require bidirectional parallel operation, synaptic plasticity, low power, and high integration characteristics.

Existing memory devices cannot operate in parallel in both directions and have difficulty in implementing synaptic plasticity. Accordingly, research on memory devices with various structures, made of various materials, such as Resistive Random-Access Memory (ReRAM), Phase Change Memory (PCM), and conductive bridge memory (CBRAM), is underway.

In particular, SNN is considered the most powerful computational tool for complex pattern recognition, classification and function evaluation due to the characteristics thereof such as high speed, real-time operation and biological fidelity.

Unlike the already widely used Deep Neural Network (DNN)-based technology, an SNN, which is a network mimicking the behavior of the human brain, can process information by controlling the strength of synaptic connections through interaction between neurons and exchanging electrical signals.

In an SNN, neuronal circuits create a series of spikes to carry information, and encode the input signal to generate the spikes. In an SNN, a number of neuronal circuits is connected to neural microchips to process inputs and outputs that are accumulated and interconnected.

Accordingly, to construct a hardware-based SNN, an efficient neuron circuit design with a small area and low power consumption is the most important consideration.

A ring oscillator has a structure wherein an odd number of complementary Metal-Oxide-Semiconductor (CMOS) inverter stages composed of a p-type Metal-Oxide-Semiconductor Field-Effect Transistor (MOSFET) and an n-type MOSFET are connected to each other in cascade to be oscillated.

A ring oscillator with a simple structure is an essential circuit element for configuring electronic circuits, and is used as a clock generator in analog and digital integrated circuits such as logic switching circuits, microprocessors, and memories.

Meanwhile, in the case of existing von Neumann-based systems, a memory and a processor are separated from each other and connected to each other through a bus. However, as performance increases, a bottleneck problem has occurred with regard to data processing speed, which presents a limitation in processing large amounts of data. To address such a problem, research on neuromorphic technology that performs parallel processing by imitating human neural structures with hardware is accelerating, and ring oscillators are used as essential circuit elements in neuromorphic technology to mimic biological signals.

Distributed, parallel and event-driven computations in the biological neuron system may be efficient, unlike centralized and sequential computations in the von Neumann computing system.

Biomimetic computing systems have recently been implemented at the software level, but the hardware thereof is based on the existing von Neumann architecture.

Although CMOS-based neuromorphic circuits have been developed for spike-based calculations, the complexity of the circuit and the lack of critical dynamics of biological systems may motivate utilization of new memory device technologies such as phase change memory, resistive memory and ferroelectric memory.

In biological cells, interconnected positive and negative feedback loops of chemical reactions should generate biological oscillations and should serve to provide high accuracy even under high noise from biological neurons.

Accordingly, artificial neuron-based memristor devices have been proposed to implement biologically inspired systems, but the spike response of neurons is caused by innate memory mechanics rather than vibrational mechanics, thus using stochastic neuron functionality and being explained using probabilistic switching mechanics.

In addition, the need for external bias or power supply for circuit operation may be limited in emulating biological neurons that operate only as input signals.

In particular, research on a Negative Differential Resistance (NDR) oscillator using the NDR phenomenon of Metal-Insulator Transition (MIT) materials such as $VO_2$ and $NbO_x$, in addition to a ring oscillator based on the CMOS integrated circuit technology to improve the degree of integration in the neuromorphic technology, is also being conducted.

The NDR oscillator is constructed using MIT devices and resistors, thus exhibiting excellent performance, in terms of integration, compared to existing CMOS-based ring oscillators.

Existing NDR oscillators using MIT materials cannot utilize an existing CMOS process, and application of CMOS-based ring oscillators to the neuromorphic technology is limited in terms of integration despite excellent performance thereof due to use of a large number of transistors.

Accordingly, there is a need for development of an oscillator capable of utilizing a CMOS process and provided with a small number of devices as in an NDR oscillator.

RELATED ART DOCUMENTS

Patent Documents (Patent Document 1) Korean Patent Application Publication No. 2017-0138047, entitled "NEUROMORPHIC DEVICES AND CIRCUITS"

(Patent Document 2) Korean Patent Application Publication No. 2018-0127153, entitled "INTEGRATED CIRCUIT EMULATING NEURAL SYSTEM WITH NEURON CIRCUIT AND SYNAPSE DEVICE ARRAY AND FABRICATION METHOD THEREOF"

Non-Patent Documents (Non-patent Document 1) M. Vardhana, N. Arunkumar, S. Lasrado, E. Abdulhay, and, G. Ramirez "Convolutional neural network for bio-medical image segmentation with hardware acceleration." Cognitive Systems, vol. 50, pp. 10-14, August 2018, doi: 10.1016/j.cogsys.2018.03.005.

(Non-patent Document 2) G. Cauwenberghs. "An analog VLSI recurrent neural network learning a continuous-time trajectory." IEEE Transactions on Neural Networks, vol. 7, no. 2, pp. 346-361, March 1996, doi: 10.1109/72.485671.

SUMMARY OF THE DISCLOSURE

Therefore, the present disclosure has been made in view of the above problems, and it is an object of the present disclosure to provide a spike pulse generation circuit capable of selectively generating a spike pulse, particularly capable of non-periodically generating a spike pulse to operate as a neuron-mimicking circuit and periodically generating spike pulses to operate as a ring oscillator.

It is another object of the present disclosure to provide a spike pulse generation circuit comprising a single silicon device based on CMOS having oscillatory and stochastic neuronal dynamics.

It is another object of the present disclosure to provide a spike pulse generation circuit comprising a single silicon device, which can adopt an existing CMOS process, and resistors, thereby being capable of improving processing speed and integration limits due to separation of a memory and a processor and performing processing like a human brain.

It is another object of the present disclosure to provide a spike pulse generation circuit comprising a single silicon device configured to use interconnected positive and negative feedback loops of charge carriers that generate neuronal oscillation similar to a biological neuron.

It is another object of the present disclosure to provide a spike pulse generation circuit comprising a single silicon device capable of performing neuronal behaviors sensitive to an analog input because a potential well formed in a channel region of the single silicon device serves as a membrane and charge carriers can be continuously stored in the potential well.

It is another object of the present disclosure to provide a spike pulse generation circuit comprising a single silicon device configured to have two terminals, i.e., input and output terminals, similar to a biological neuron, thereby not requiring an external power supply and a bias input.

It is yet another object of the present disclosure to provide a spike pulse generation circuit comprising a single silicon device capable of implementing oscillatory neuronal functionalities and stochastic neuronal functionalities using stochastic feedback switching dynamics.

In accordance with an aspect of the present disclosure, the above and other objects can be accomplished by the provision of a spike pulse generation circuit comprising a single silicon device, wherein a positive feedback loop is generated in the single silicon device when a potential generated by an input voltage exceeds a threshold, and each of spike pulses corresponding to the generated potential is selectively generated and output according to a generated firing event, and the selectively generated spike pulse is reset as a negative feedback loop is triggered in the single silicon device based on the generated firing event.

The spike pulse generation circuit may integrate the input voltage in a channel region of the single silicon device to generate the potential.

The channel region may include an n-doped first channel region and a p-doped second channel region, and a potential well for accumulating charge carriers may be formed in the channel region to integrate the input voltage in the channel region, wherein, when the input voltage is applied, holes are integrated in or recombined with the second channel region.

The channel region may include a potential barrier, and injection of charge carriers may be blocked before the potential exceeds the threshold.

A height of the potential barrier may be lowered as the holes are integrated in the second channel region to generate the positive feedback loop so that the channel region operates the potential barrier to be removed only for a predetermined time.

The single silicon device may be set to a latch-up state when the positive feedback loop is generated, and may be set to a latch-down state when the negative feedback loop is triggered.

A voltage of the single silicon device in the latch-up state may be reduced due to internal resistance to trigger the negative feedback loop.

The single silicon device may generate the positive feedback loop when a ratio of a composite resistance comprising the internal resistance in the latch-down state and first and second resistors to a combination of the input voltage and the internal resistance in the latch-down state is equal to or greater than a latch-up voltage.

The single silicon device may generate the negative feedback loop when a ratio of a composite resistance comprising the internal resistance in the latch-up state and first and second resistors to a combination of the input voltage and the internal resistance in the latch-up state is less than or equal to a latch-down voltage.

A magnitude and fire rate of the spike pulse may increase as a magnitude of the input voltage increases.

An interval between the spike pulses may be changed according to a magnitude of the input voltage.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1A:
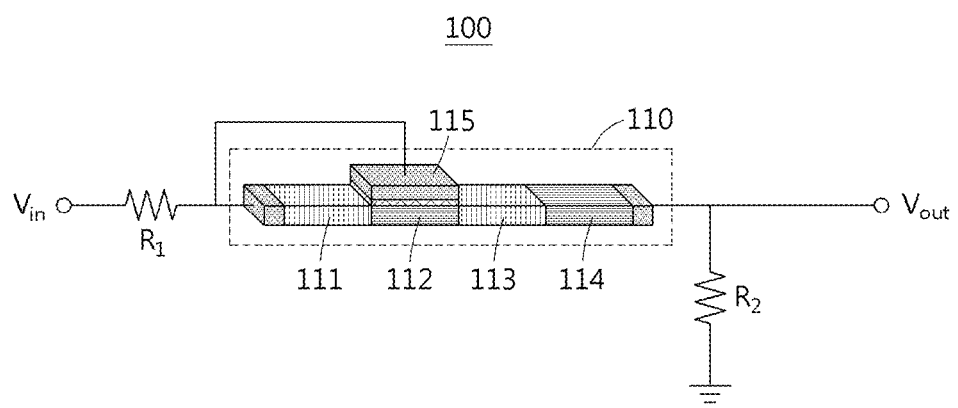
FIGS. 1A to 2D illustrate a spike pulse generation circuit comprising a single silicon device according to an embodiment of the present disclosure.

The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable for . . . ," " . . . having ability to . . . ," " . . . modified to . . . ," " . . . manufactured to . . . ," " . . . enabling to . . . ," or " . . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or".

That is, unless otherwise mentioned or clearly inferred from context, the expression "x uses a or b" means any one of natural inclusive permutations.

Hereinafter, the terms, such as 'unit' or 'module', etc., should be understood as a unit that processes at least one function or operation and that may be embodied in a hardware manner, a software manner, or a combination of the hardware manner and the software manner.

FIGS. 1A to 2D illustrate a spike pulse generation circuit comprising a single silicon device according to an embodiment of the present disclosure.

FIG. 1A illustrates components of the spike pulse generation circuit comprising the single silicon device according to an embodiment of the present disclosure.

For example, the single silicon device may be interpreted as a device such as a diode structure.

Referring to FIG. 1A, a spike pulse generation circuit 100 comprising a single silicon device 110 includes two terminals, i.e., an input terminal $V_{in}$ and the output terminal $V_{out}$. The single silicon device 110 and a plurality of resistors may be included between the input terminal $V_{in}$ and the output terminal $V_{out}$. For example, the spike pulse generation circuit 100 comprising the single silicon device 110 may be referred to as an oscillator circuit when a spike pulse is periodically generated. On the other hand, the spike pulse generation circuit 100 may be referred to as a neuron-mimicking circuit when a spike pulse is non-periodically generated.

Accordingly, the present disclosure may provide a spike pulse generation circuit capable of selectively generating a spike pulse to non-periodically generate a spike pulse so as to operate as a neuron-mimicking circuit or to periodically generate a spike pulse so as to operate as a ring oscillator.

In accordance with an embodiment of the present disclosure, the single silicon device 110 may include a drain region 111, a first channel region 112, a second channel region 113, a source region 114 and a gate region 115. Here, the gate region 115 may be formed on the first channel region 112.

For example, the single silicon device 110 may include the drain region 111, channel regions comprising the first and second channel regions 112 and 113, and the source region 114, and the gate region 115 may be generated on the first channel region 112 of the channel regions. That is, the gate region 115 may be formed on the channel region.

In addition, a drain terminal of the drain region 111 and a gate terminal of the gate region 115 may be connected in parallel to the input terminal $V_{in}$ to which an input voltage is applied, and a source terminal of the source region 114 may be connected in series to the output terminal $V_{out}$ through which a spike pulse is output.

For example, a single silicon device may be referred to as any one of a SiNW FBFET, a p-n-p-n transistor, a p-n-i-n transistor, a memory device, a semiconductor device, a diode structure, a gated p-n-p-n diode and a storage device.

In accordance with an embodiment of the present disclosure, a single silicon device may be set to a high resistance state or a low resistance state in relation to an applied voltage, and may store data in the first logic state and data in the second logic state.

In addition, the single silicon device may output current corresponding to stored data or may maintain stored data without loss.

For example, the data in the first logic state may represent '1', and the data in the second logic state may represent '0'. Meanwhile, although the data in the first logic state is described as '1' and the data in the second logic state is described as '0' above, the data may be flexibly changed according to memory setting.

Meanwhile, an operation of the single silicon device as a memory, i.e., an operation of storing the data in the first logic state, may also be referred to as programming.

In addition, an operation of the single silicon device as a memory, i.e., an operation of storing data in the second logic state, may also be referred to as erasing.

In accordance with an embodiment of the present disclosure, the drain region 111 may be a region doped with a high concentration of p-type impurities, and a drain terminal of the drain region 111 may be connected in series to the input terminal $V_{in}$ through a first resistor $R_1$ and may be connected in parallel to the gate terminal of the gate region 115.

For example, the first channel region 112 may be a region doped with n-type impurities, and the second channel region 113 may be a region doped with p-type impurities. The first and second channel regions 112 and 113 may form a potential well and may include a potential barrier.

For example, the potential barrier may block charge carrier injection before a potential exceeds a threshold.

That is, the potential barrier may prevent charge carriers from flowing into the second channel region 113 before the potential exceeds the threshold.

That is, the channel regions may include the n-doped first channel region 112 and the p-doped second channel region 113.

In the channel regions, a potential well for accumulating charge carriers may be generated to accumulate an input voltage $V_{in}$. When the input voltage $V_{in}$ is applied, holes may be accumulated in or recombined with the second channel region 113.

The source region 114 may be a region doped with a high concentration of n-type impurities. A source terminal of the source region 114 may be connected in parallel to the second resistor $R_2$ and a parasitic capacitance and may be connected in series to the output terminal $V_{out}$.

p+ may represent a case of being doped with a high concentration of p-type impurities, and n+ may represent a case of being doped with a high concentration of n-type impurities.

For example, the resistance of the first resistor $R_1$ may be 10 MΩ, and the resistance of the second resistor $R_2$ may be 1 MΩ.

In accordance with an embodiment of the present disclosure, the spike pulse generation circuit 100 comprising the single silicon device 110 may accumulate an input voltage in the channel region of the single silicon device 110 to generate a potential. For example, the input voltage may correspond to the entire signal that is input from a synapse.

For example, the voltage accumulated in the channel region may be subjected to a process of being accumulated in the form of current in a state of being changed into current through the resistor or the like.

For example, in the case of the spike pulse generation circuit 100 comprising the single silicon device 110, a positive feedback loop may be generated in the single silicon device 110 when a potential exceeds a threshold, thereby selectively generating and outputting a spike pulse corresponding to a potential according to a generated firing event.

That is, the spike pulse generation circuit 100 comprising the single silicon device 110 may periodically or non-periodically generate and output a spike pulse.

For example, the threshold may correspond to a reference value for generating a positive feedback loop or a reference value for removing a potential barrier.

In accordance with an embodiment of the present disclosure, in the case of the spike pulse generation circuit 100 comprising the single silicon device 110, a negative feedback loop may be triggered based on a firing event in the single silicon device 110, thus resetting a selectively generated spike pulse.

In accordance with an embodiment of the present disclosure, the height of the potential barrier is lowered as holes are accumulated in the second channel region 113 to generate a positive feedback loop so that the channel region operates the potential barrier to be removed only for a predetermined time.

For example, the single silicon device 110 may be set to a latch-up state when a positive feedback loop is generated, and the single silicon device 110 may be set to a latch-down state when a negative feedback loop is triggered.

In accordance with an embodiment of the present disclosure, in the case of the single silicon device, voltage may be reduced due to internal resistance in a latch-up state and thus a negative feedback loop may be triggered.

In accordance with an embodiment of the present disclosure, the spike pulse generation circuit 100 comprising the single silicon device 110 may generate a positive feedback loop based on Equations 1 and 2 below.

$$\frac{V_{in} \times R_{latch-down}}{R_{latch-down} + R_1 + R_2} \geq V_{latch-up} \quad \text{[Equation 1]}$$

In Equation 1, $V_{in}$ may denote an input voltage, $R_{latch-down}$ may denote an internal resistance in a latch-down state, $R_1$ may denote a first resistor, $R_2$ may denote a second resistor, and $V_{latch-up}$ may denote a latch-up voltage.

$$\frac{V_{in} \times R_{latch-up}}{R_{latch-up} + R_1 + R_2} \leq V_{latch-down} \quad \text{[Equation 2]}$$

In Equation 2, $V_{in}$ may denote an input voltage, $R_{latch-up}$ may denote an internal resistance in a latch-up state, $R_1$ may denote a first resistor, $R_2$ may denote a second resistor, and $V_{latch-down}$ may denote a latch-down voltage.

For example, the single silicon device may generate the positive feedback loop when a ratio of a composite resistance comprising the internal resistance in the latch-down state and first and second resistors to a combination of the input voltage and the internal resistance in the latch-down state is equal to or greater than a latch-up voltage.

In addition, the single silicon device may generate the negative feedback loop when a ratio of a composite resistance comprising the internal resistance in the latch-up state and first and second resistors to a combination of the input voltage and the internal resistance in the latch-up state is less than or equal to a latch-down voltage.

In accordance with an embodiment of the present disclosure, the single silicon device may generate a positive feedback loop when an input voltage is swept from 0 V to 3 V, and may trigger a negative feedback loop when an input voltage is swept from 3 V to 0 V.

For example, the magnitude and fire rate of the spike pulse may increase as the magnitude of the input voltage increases.

For example, when the magnitude of the input voltage increases, a generation rate of an interspike, which is an interval of the spike pulse, may increase. The generation rate of the interspike may be related to the fire rate of the spike pulse.

In addition, an interval of the spike pulse may be changed depending upon the magnitude of the input voltage.

That is, the interval of the spike pulse may be reduced as the magnitude of the input voltage increases, and the interval may increase as the magnitude of the input voltage is decreased.

For example, the spike pulse may correspond to an oscillation signal.

In the case of the spike pulse generation circuit 100 comprising the single silicon device 110 according to an embodiment of the present disclosure, gains of positive and negative feedback loops may be adjusted through a resistance value and design change to change an oscillation waveform.

For example, in the case of the spike pulse generation circuit 100 comprising the single silicon device 110, a square-shaped square wave pulse may be repeatedly generated because generation of a latch-down phenomenon due to a negative feedback loop, after a latch-up phenomenon due to a positive feedback loop, is delayed when a gain of the positive feedback loop is increased and a gain of the negative feedback loop is decreased. In addition, because the square wave pulse may be repeatedly generated, the square wave pulse may be utilized as a clock signal.

For example, since a feedback loop is formed by injection of carriers, an oscillation frequency may be adjusted through an input voltage. That is, when the input voltage is increased, injection of carriers increases so that the oscillation frequency increases. When the input voltage is reduced, the oscillation frequency is reduced.

In addition, a feedback phenomenon occurs through a process of accumulating and dissipating charges in a potential well in a channel of a single silicon device, which indicates that it may be used as a membrane of an existing spike pulse generation circuit that charges and discharges a capacitor.

Since a leaky integrate-and-fire function that enables leaky integration in a potential well, ignition through the latch-up phenomenon caused by a positive feedback loop, and a reset process through the latch-down phenomenon caused by a negative feedback loop may be performed according to the present disclosure, the present disclosure may also be utilized as a spike pulse generation circuit that does not require a capacitor performing neuron operation with an input flowing into an input terminal of a circuit without a separate external power source.

Figure 1B:
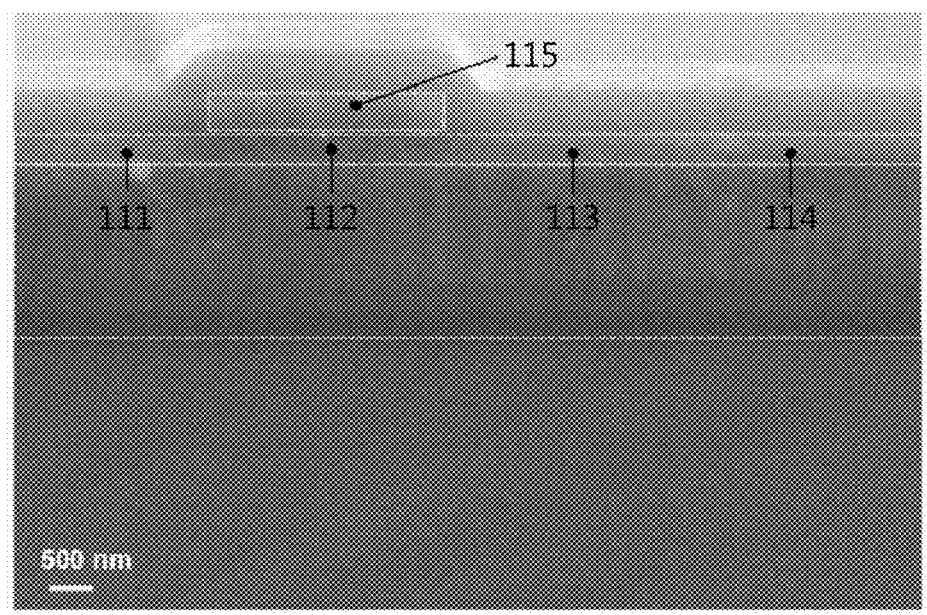

FIG. 1B illustrates an electron microscope image of a spike pulse generation circuit comprising a single silicon device according to an embodiment of the present disclosure.

Referring to FIG. 1B, the spike pulse generation circuit includes a single silicon device. Here, the single silicon device includes a drain region 111, a first channel region 112, a second channel region 113, a source region 114 and a gate region 115.

Figure 1C:
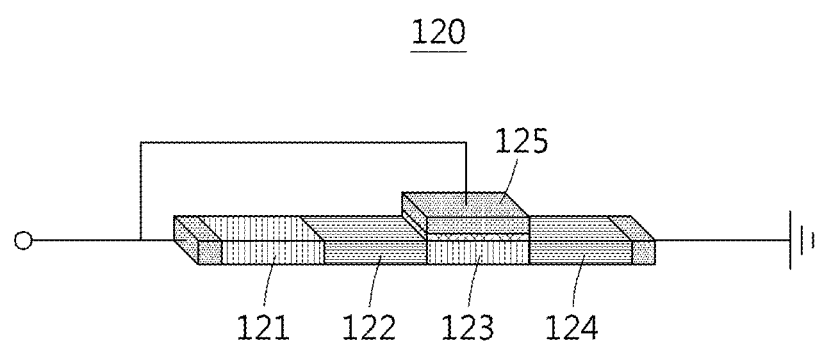
Figure 1D:
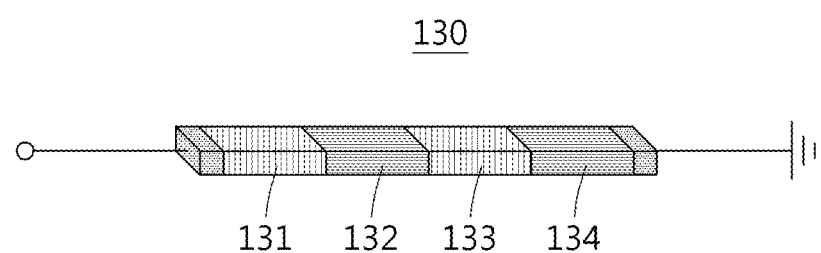

FIGS. 1C and 1D illustrate single silicon devices with various structures according to embodiments of the present disclosure included in spike pulse generation circuits.

Referring to FIG. 1C, the single silicon device 120 includes a drain region 121, a first channel region 122, a second channel region 123, a source region 124 and a gate region 125.

For example, the gate region 125 may be generated and positioned on the second channel region 123.

In accordance with an embodiment of the present disclosure, the single silicon device 120 may replace the single silicon device 110 illustrated in FIG. 1A.

Referring to FIG. 1D, a single silicon device 130 includes a drain region 131, a first channel region 132, a second channel region 133 and a source region 134.

In accordance with an embodiment of the present disclosure, the single silicon device 130 may replace the single silicon device 110 illustrated in FIG. 1A.

FIGS. 2A to 2D illustrate spike pulse generation circuits with various structures according to a change in resistance configuration, the spike pulse generation circuits comprising the single silicon device according to an embodiment of the present disclosure.

Figure 2A:
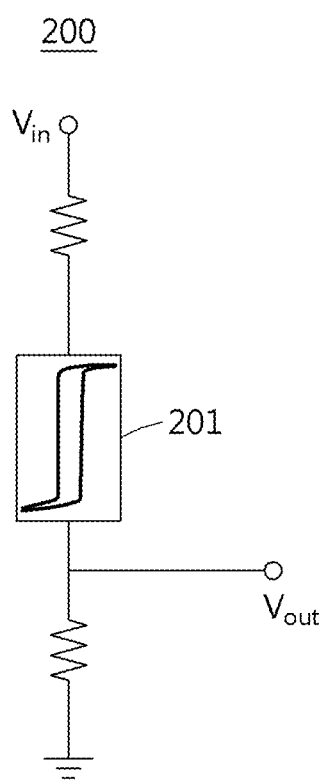

Referring to FIG. 2A, a spike pulse generation circuit 200 comprising a single silicon device 201 according to an embodiment of the present disclosure may have a structure wherein resistors are located at both ends of the single silicon device 201, an input voltage of an input terminal is input through the resistor, and an output terminal is connected in parallel to the resistor.

Figure 2B:
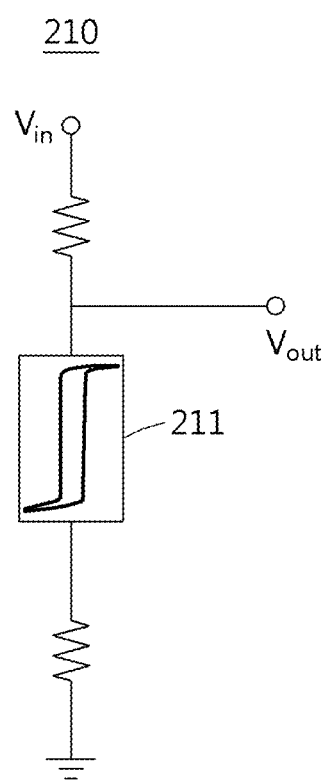

Referring to FIG. 2B, a spike pulse generation circuit 210 comprising a single silicon device 211 according to an embodiment of the present disclosure may have a structure wherein resistors are located at both ends of the single silicon device 211, and an input terminal and an output terminal are connected to a drain terminal of the single silicon device 211.

Figure 2C:
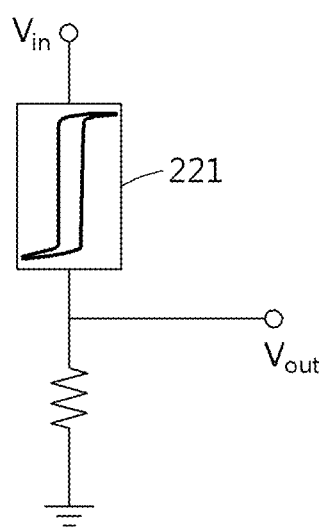

Referring to FIG. 2C, a spike pulse generation circuit 220 comprising a single silicon device 221 according to an embodiment of the present disclosure may have a structure wherein both ends of the single silicon device 221 are connected to an input terminal and an output terminal regardless of a resistor.

Figure 2D:
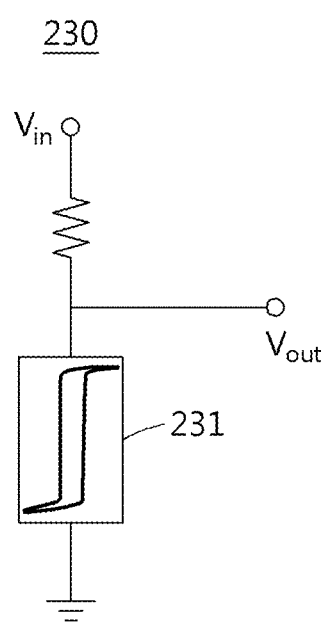

Referring to FIG. 2D, a spike pulse generation circuit 230 comprising a single silicon device 231 according to an embodiment of the present disclosure may have a structure wherein an input terminal is connected to a drain terminal of the single silicon device 231 via a resistor, and an output terminal is connected to the drain terminal of the single silicon device 231 without a resistor.

The single silicon devices 110, 120, and 130 illustrated in FIGS. 1A, 1C and 1D may be applied to the single silicon devices 201, 211, 221, and 231 of FIGS. 2A to 2D.

Figure 3A:
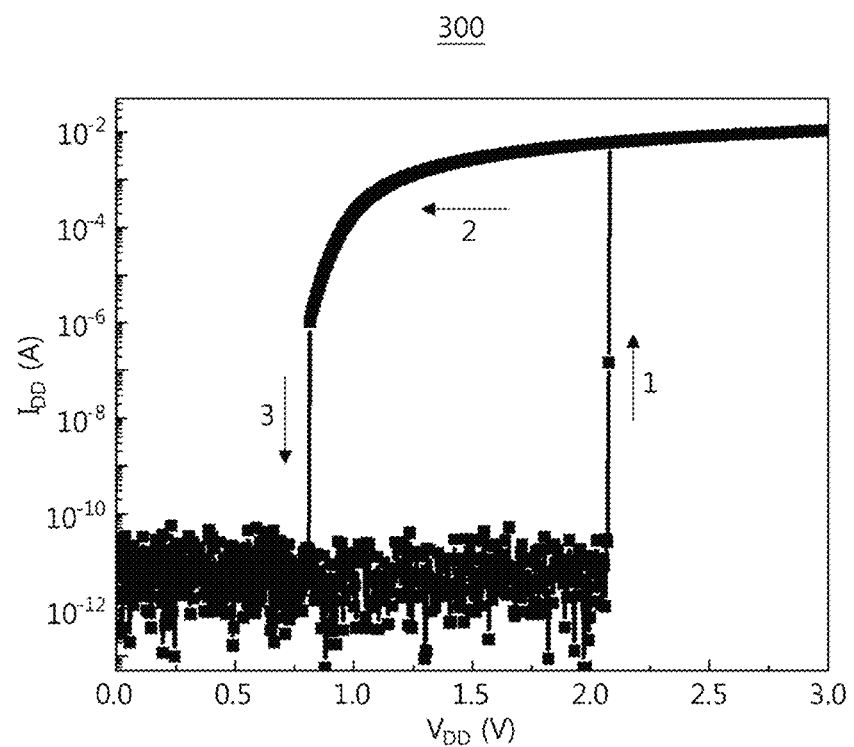
FIG. 3A illustrates current and voltage characteristics of a spike pulse generation circuit comprising a single silicon device according to an embodiment of the present disclosure.

FIG. 3A illustrates current and voltage characteristics of a spike pulse generation circuit comprising a single silicon device according to an embodiment of the present disclosure.

FIG. 3A illustrates current and voltage characteristics at room temperature of the spike pulse generation circuit comprising the single silicon device according to an embodiment of the present disclosure.

Referring to a graph 300 of FIG. 3A, the graph 300 shows a change in the drain current $I_{DD}$ dependent upon a change in a drain voltage $V_{DD}$. In particular, a positive feedback loop is generated when the drain voltage $V_{DD}$ is swept from 0 V to 3 V so that a drain current $I_{DD}$ increases according to a rapid current increase (1) corresponding to a latch-up state in a latch-up voltage $V_{latch-up}$.

In addition, the graph 300 shows that a negative feedback loop is triggered when the drain voltage $V_{DD}$ is swept from 3 V to 0 V so that the drain current $I_{DD}$ is reduced according to a rapid current decrease (3) corresponding to a latch-down state in a latch-down voltage $V_{latch-down}$.

That is, the spike pulse generation circuit comprising the single silicon device generates a positive feedback loop when a drain voltage corresponding to an input voltage is applied at a magnitude of about 2.3 V or higher so that a firing event is generated to generate and output a spike pulse.

In addition, in the case of the spike pulse generation circuit comprising the single silicon device, the drain voltage $V_{DD}$ that is input according to an increase in an internal resistance is reduced upon generation of a firing event so that a negative feedback loop is triggered to reset a spike pulse.

Figure 3B:
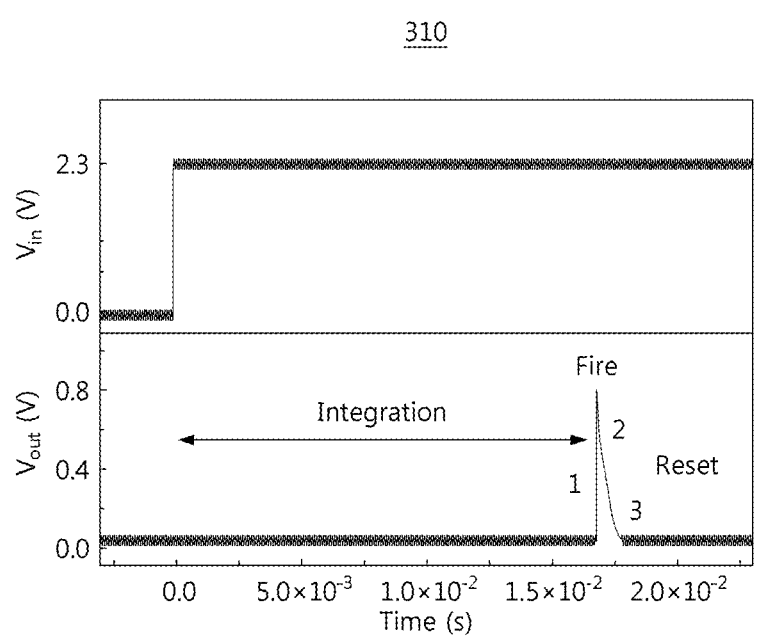
FIG. 3B illustrates a spike response characteristic of a spike pulse generation circuit comprising a single silicon device according to an embodiment of the present disclosure.

FIG. 3B illustrates a spike response characteristic of a spike pulse generation circuit comprising a single silicon device according to an embodiment of the present disclosure.

FIG. 3B illustrates an integration time for generating a spike response in the spike pulse generation circuit comprising the single silicon device according to an embodiment of the present disclosure.

Referring to a graph 310 of FIG. 3B, the graph 310 illustrates a change in an output voltage $V_{out}$ dependent upon an input voltage $V_{in}$.

For example, when the input voltage $V_{in}$ is applied at a magnitude of 2.3 V, a positive feedback loop is generated after a certain period of integration to generate and output a spike pulse (1). Simultaneously with the output of the spike pulse, the input voltage $V_{in}$ is reduced by 2.3 V (2) by internal resistance so that a negative feedback loop is triggered to reset the spike pulse (3).

For example, the spike pulse generation circuit comprising the single silicon device may generate a positive feedback loop according to integration and fire dynamics and may trigger a feedback loop according to an output spike to be automatically reset to an initial state after a firing event, similar to a biological neuron channel.

In accordance with an embodiment of the present disclosure, by the spike pulse generation circuit comprising the single silicon device, positive and negative feedback loops are repeated to a generate a plurality of continuous spike pulses, thereby generating neuronal oscillation.

For example, the spike pulse generation circuit comprising the single silicon device may be controlled by adjusting an input amplitude to the number of spike events within a preset time interval.

In accordance with an embodiment of the present disclosure, the spike pulse generation circuit comprising the single silicon device may generate and output a spike pulse corresponding to oscillation, based on a latch-up phenomenon due to a positive feedback loop and a latch-down phenomenon due to a negative feedback loop, when a constant voltage is applied.

Figure 4A:
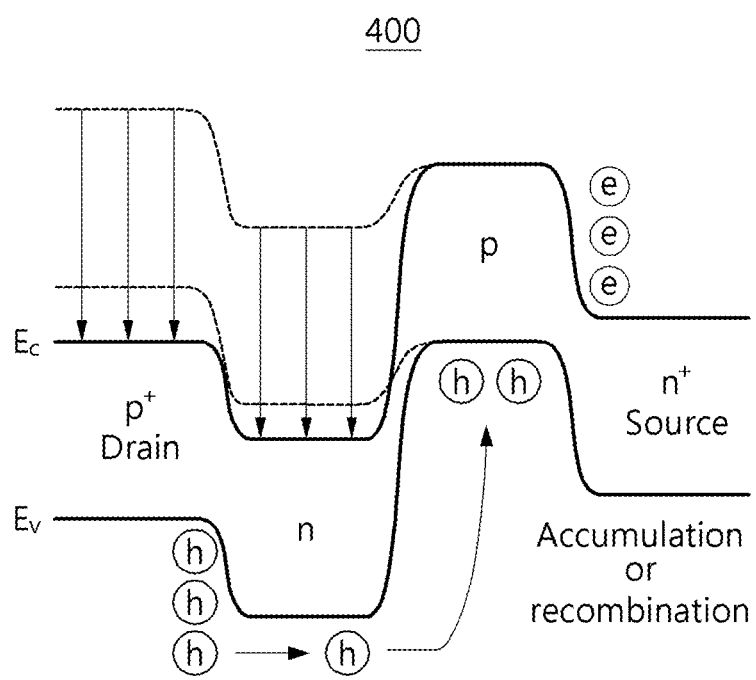
FIGS. 4A to 4C illustrate operation states of a spike pulse generation circuit comprising a single silicon device according to an embodiment of the present disclosure.
Figure 4B:
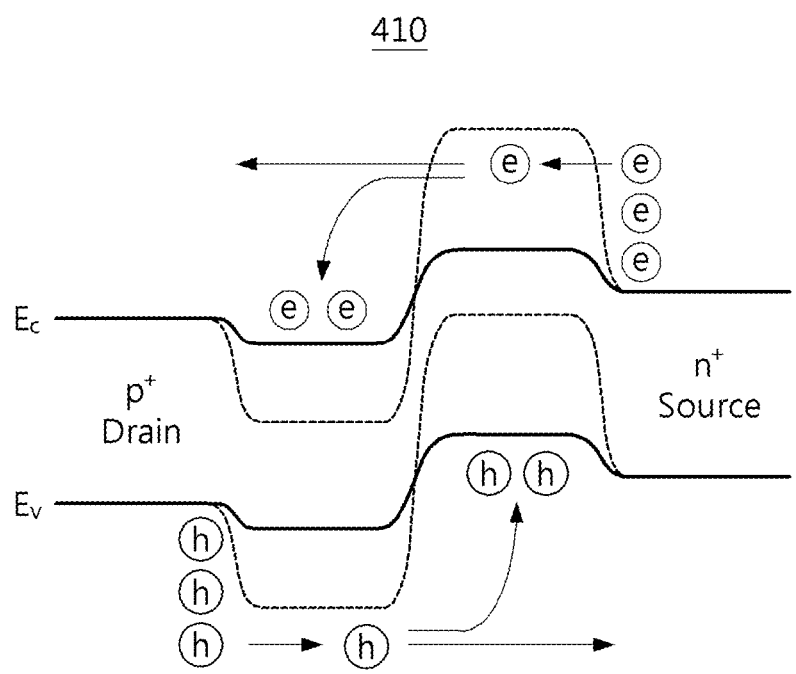
Figure 4C:
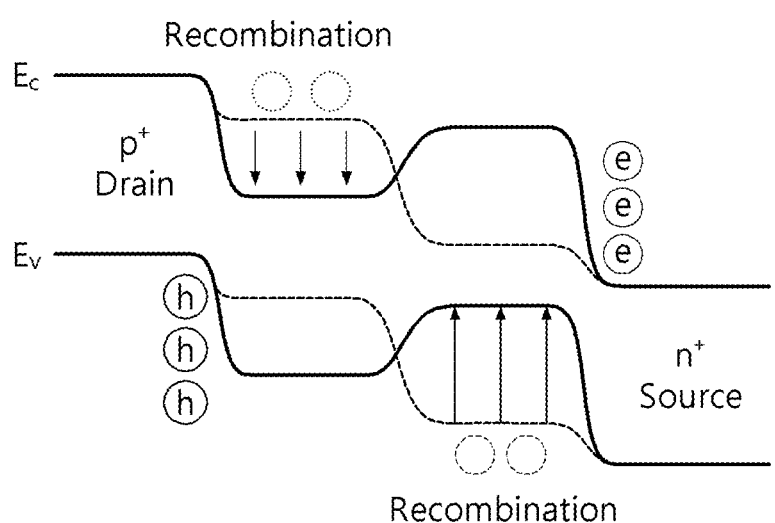

FIGS. 4A to 4C illustrate operation states of a spike pulse generation circuit comprising a single silicon device according to an embodiment of the present disclosure.

FIG. 4A is an energy band diagram illustrating a leaky integration operation state of the spike pulse generation circuit comprising the single silicon device according to an embodiment of the present disclosure.

Referring to an energy band diagram 400 of FIG. 4A, the spike pulse generation circuit comprising the single silicon device generates a spike pulse after five pulses arrive and then a membrane potential reaches a threshold value, so as to implement a probabilistic fire response to a neuron network based on a spike response function of an analog input.

In addition, the spike pulse generation circuit comprising the single silicon device may realize integration and recombination of charge carriers in a potential well by Shockley-Read-Hall generation and recombination or a band-to-band tunneling process based on stochastic feedback switching dynamics.

For example, a spike response associated with the generation of spike pulses of analog or mixed signals in artificial neurons is one of neuronal functions for analog computation in neural networks.

Referring to the energy band diagram 400, a potential barrier is formed and holes are accumulated or recombined in the second channel region. As holes are accumulated, a potential barrier of the second channel region may be reduced.

In addition, when a sine wave is applied to an input node, analog tuning in an artificial neuron is implemented by modulation of a neuron oscillation frequency, and individual spike amplitudes may be almost constant although a stimulation threshold value may be exceeded by a sinusoidal input signal.

FIG. 4B is an energy band diagram illustrating a fire operation state of a spike pulse generation circuit comprising a single silicon device according to an embodiment of the present disclosure.

Referring to an energy band diagram 410 of FIG. 4B, a potential barrier collapses to generate a positive feedback loop when a potential exceeds a threshold. As the potential barrier collapses, charge carriers (electrons) move to the channel region.

FIG. 4C is an energy band diagram illustrating a reset operation state of a spike pulse generation circuit comprising a single silicon device according to an embodiment of the present disclosure.

Referring to an energy band diagram 420 of FIG. 4C, integration and recombination of charge carriers occur in a potential well and, as charge carriers move to a channel region, a negative feedback loop is triggered, so that the spike pulse generation circuit comprising the single silicon device returns to an initial state thereof.

Here, the group of charge carriers in the potential well may not be the same as charge carriers in the potential well in an initial state.

In accordance with an embodiment of the present disclosure, the potential well in the single silicon device of the spike pulse generation circuit may store or release electrons, i.e., may act as a membrane. In addition, a latch-up phenomenon due to a positive feedback loop may selectively fire a spike pulse, and a negative feedback loop may selectively reset a spike pulse through a latch-down phenomenon.

For example, the spike pulse generation circuit comprising the single silicon device may periodically generate a spike pulse to have a constant period, or may non-periodically generate a spike pulse without a constant period.

FIGS. 5A to 5D illustrate neuron spiking behavior test results of a spike pulse generation circuit comprising a single silicon device according to an embodiment of the present disclosure.

FIGS. 5A to 5D illustrate operation characteristics of the spike pulse generation circuit comprising the single silicon device according to an embodiment of the present disclosure.

Figure 5A:
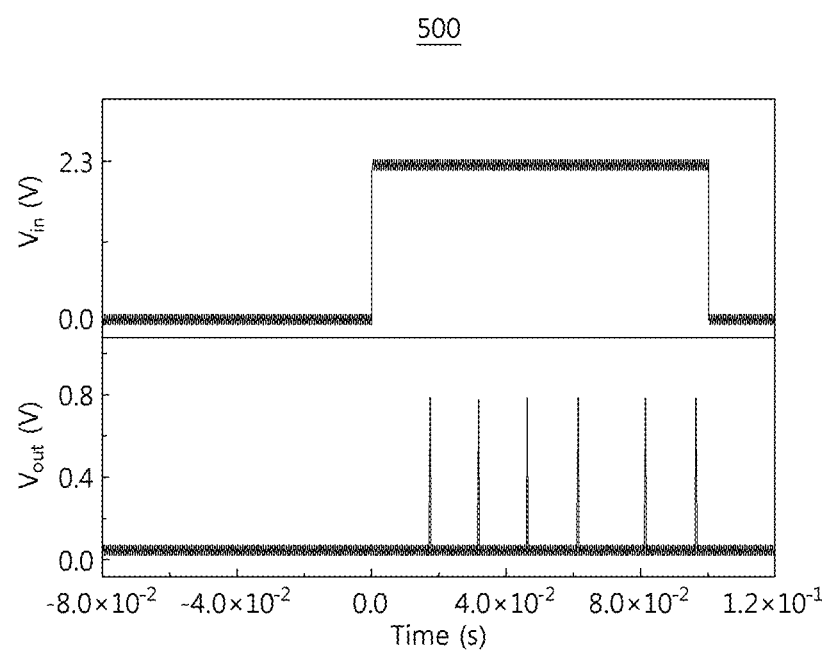
FIGS. 5A to 5D illustrate neuron spiking behavior test results of a spike pulse generation circuit comprising a single silicon device according to an embodiment of the present disclosure.

A graph 500 of FIG. 5A illustrates a change in an output voltage dependent upon an input voltage. When an input voltage is 2.3 V or higher, spike pulses are observed at regular intervals in an output voltage.

That is, the intrinsic probability of the spike pulse generation circuit comprising the single silicon device may represent distribution of interspike intervals defined as a time difference between multiple leak integration and successive spike pulse occurrence in a fire cycle.

When the distribution of the spike intervals is periodic, the spike pulse generation circuit comprising the single silicon device may operate as a ring oscillator circuit.

For example, probabilistic dynamics sensitive to input noise of the spike pulse generation circuit comprising the single silicon device lead to a symmetric distribution of interspike intervals.

Figure 5B:
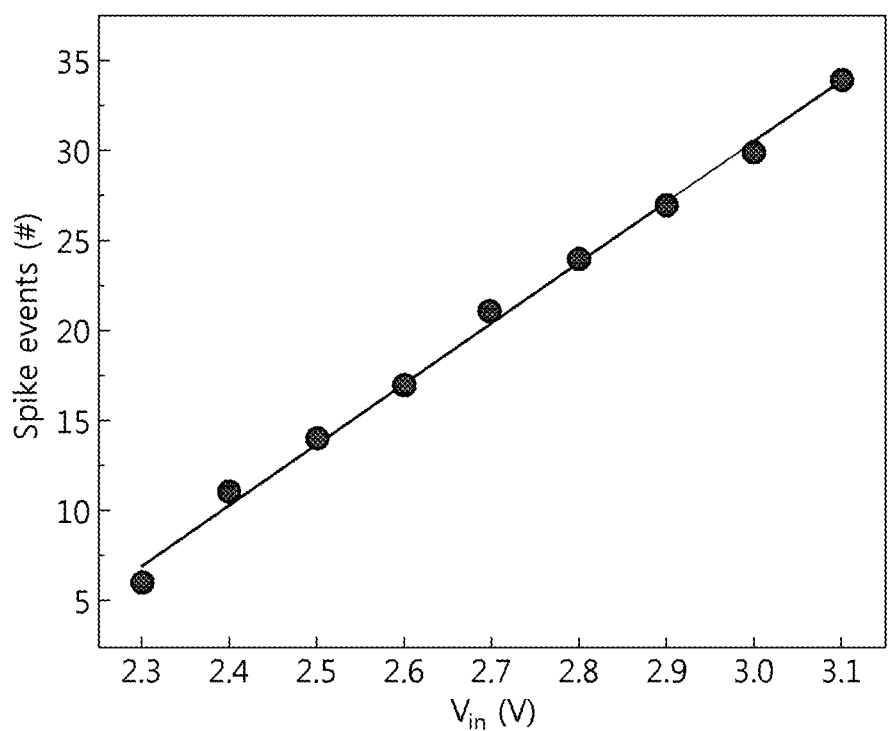

A graph 510 of FIG. 5B illustrates the occurrence frequency of spike events dependent upon an increase in an input voltage.

For example, in the spike pulse generation circuit comprising the single silicon device, an interspike interval around a continuous spike average response may be reduced when an input voltage increases from 2.3 V to 3.1 V.

That is, the spike pulse generation circuit comprising the single silicon device may output and reset a spike pulse at a higher frequency when an input voltage increases.

For example, by increasing the magnitude of an input voltage from 2.3 V to 3.1 V, an average fire rate of continuous spikes may be adjusted from 61.0 Hz to 210.5 Hz, but the consistency of spike amplitudes and the probability of frequency responses are maintained.

In addition, the distribution of an activity potential duration determined by interconnected positive and negative feedback loops may be implemented by the stochastic feedback switching dynamics.

Figure 5C:
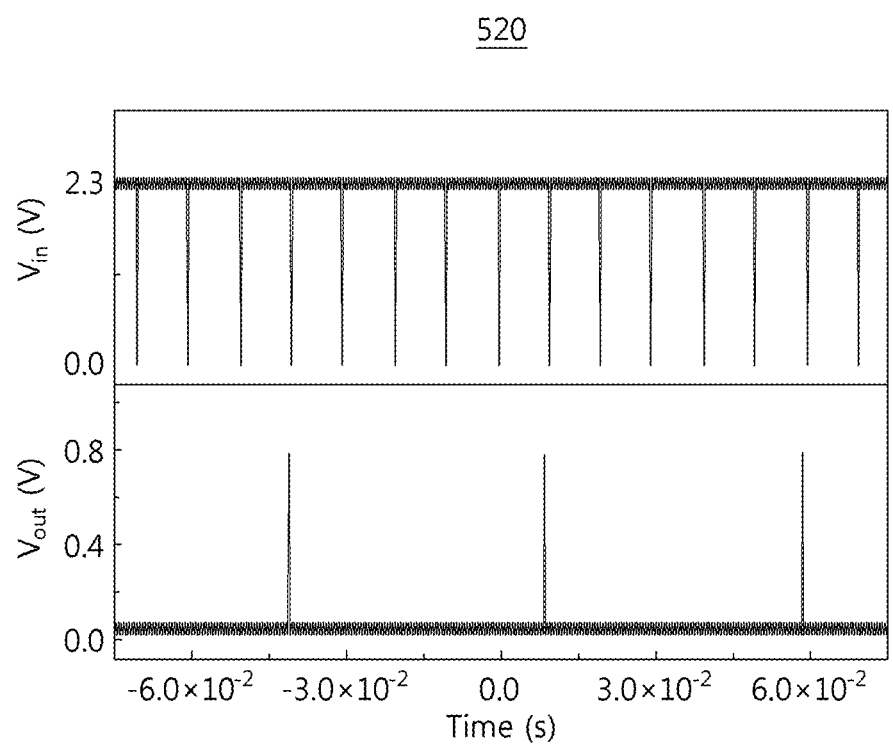

A graph 520 of FIG. 5C illustrates an output change in a spike pulse while periodically changing an input voltage from 2.3 V to 0 V.

The graph 520 shows that, even if an input voltage decreases or increases, spike pulses are output at regular intervals regardless of the voltage change.

That is, the graph 520 shows that a variation of an operation duration does not greatly depend on the magnitude of an input stimulus. This may indicate that the interconnected positive and negative feedback loops of the spike pulse generation circuit comprising the single silicon device are similar to the biological cell feedback mechanism.

Figure 5D:
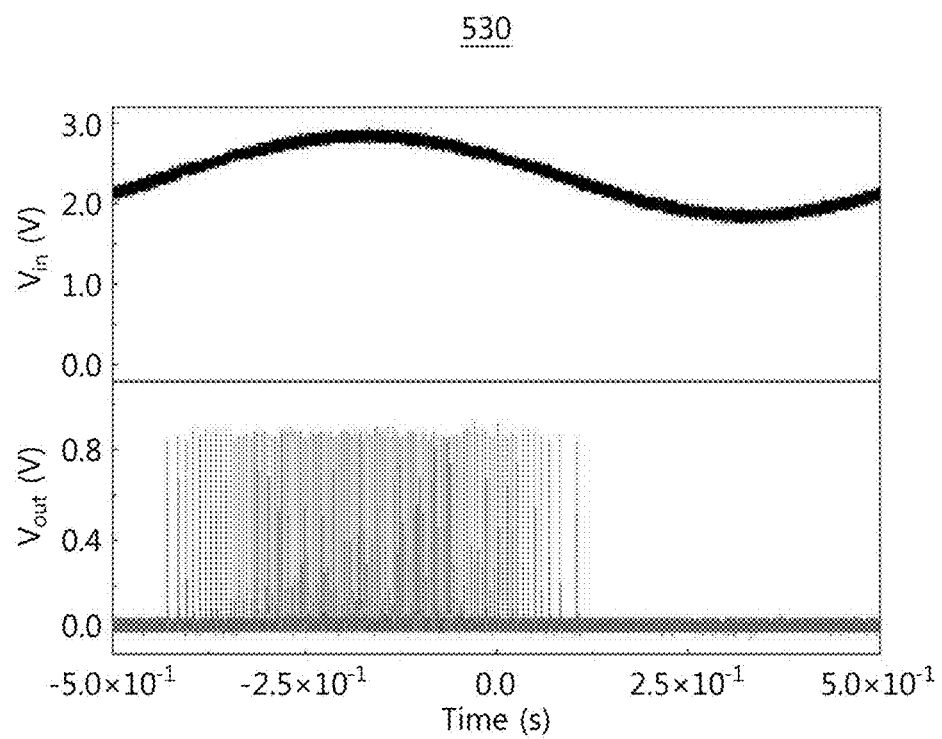

Referring to a graph 530 of FIG. 5D, an effective refractory period over an input voltage range may represent irregularities and distorted distributions.

For example, the effective refractory period is a result that may be evaluated by integration and recombination processes of charge carriers in a potential well, and may represent the probabilistic characteristics of feedback switching dynamics.

In accordance with an embodiment of the present disclosure, the spike pulse generation circuit comprising the single silicon device may adjust the magnitude of an input voltage to periodically or non-periodically adjust an output frequency of spike pulses.

That is, the spike pulse generation circuit comprising the single silicon device may constantly maintain the magnitude of the input voltage to periodically output spike pulses, or may repeatedly change the magnitude of the input voltage to non-periodically output spike pulses.

In other words, the spike pulse generation circuit comprising the single silicon device may adjust an interval at which spike pulses are generated according to the magnitude of the input voltage to periodically or non-periodically generate spike pulses.

FIGS. 5A to 5D illustrates the characteristics of leaky integrate-and-fire operations that utilize the oscillation phenomenon in the single silicon device of the spike pulse generation circuit occurring as electrons are integrated in and discharged from the potential well in the single silicon device.

In addition, the spike pulse generation circuit comprising the single silicon device may utilize a change in the oscillation frequency according to a charge input to perform a neuron operation for an analog input.

That is, the spike pulse generation circuit comprising the single silicon device may utilize an oscillation frequency change according to a charge input to operate as a neuron-mimicking circuit for an analog input according to non-periodically generated spike pulses.

In other words, the spike pulse generation circuit comprising the single silicon device may periodically generate spike pulses to operate as a ring oscillator circuit, and may non-periodically generate spike pulses to operate as a neuron-mimicking circuit.

FIGS. 6A to 6D illustrate stochastic spike characteristics of a spike pulse generation circuit comprising a single silicon device according to an embodiment of the present disclosure.

Figure 6A:
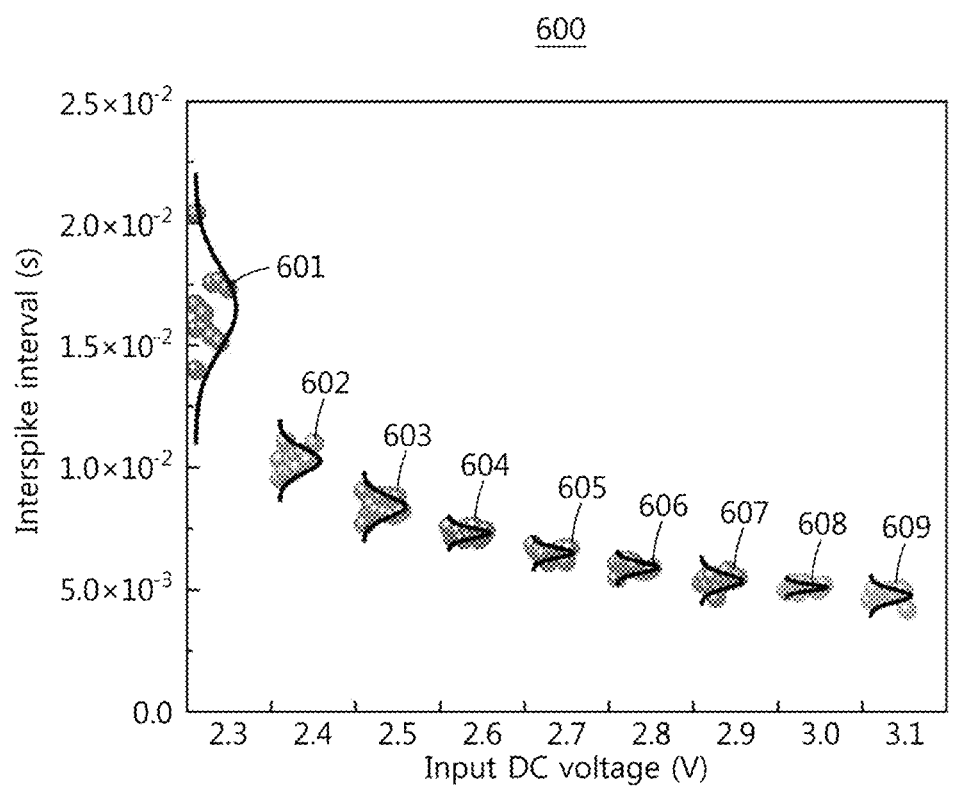
FIGS. 6A to 6D illustrate stochastic spike characteristics of a spike pulse generation circuit comprising a single silicon device according to an embodiment of the present disclosure.

A graph 600 of FIG. 6A illustrates an interspike interval dependent upon an increase in an input voltage.

The graph 600 illustrates Example 601, Example 602, Example 603, Example 604, Example 605, Example 606, Example 607, Example 608, and Example 609 according to the magnitude of voltage.

Examining the interspike intervals of Examples 601 to 609, an interspike interval may be reduced with increasing input voltage.

That is, the spike pulse generation circuit comprising the single silicon device outputs and resets spike pulses at a higher frequency as the magnitude of the input voltage increases, thereby outputting and resetting the spike pulses at narrower interspike intervals.

Figure 6B:
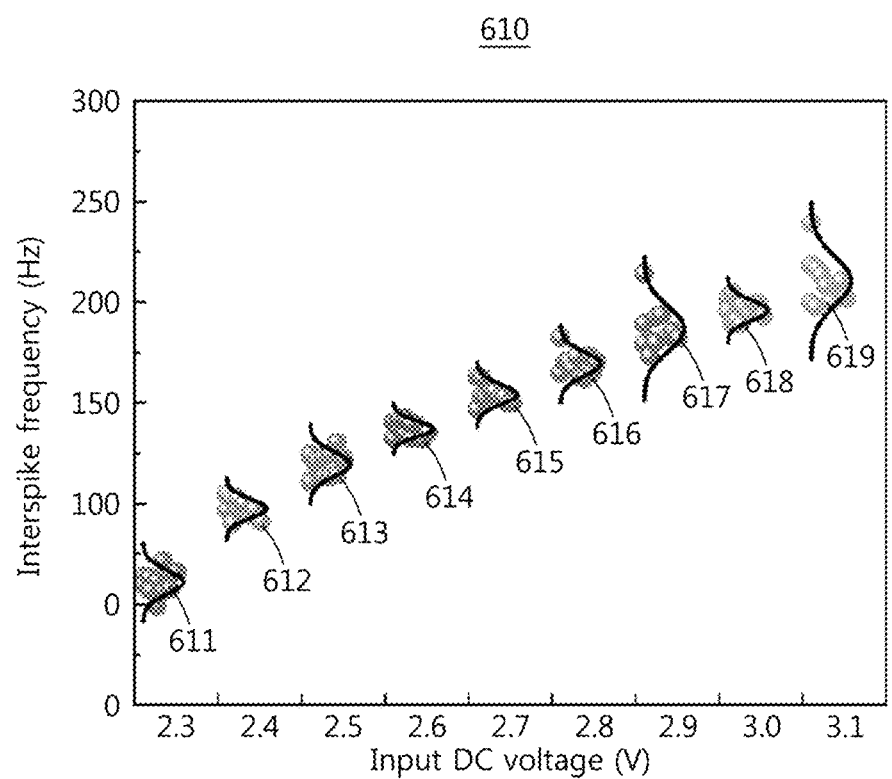

A graph 610 of FIG. 6B illustrates an interspike frequency dependent upon an input voltage increase.

The graph 610 illustrates Example 611, Example 612, Example 613, Example 614, Example 615, Example 616, Example 617, Example 618, and Example 619 according to the magnitude of voltage.

Examining the interspike frequencies of Examples 611 to 619, the interspike frequency increases with increasing input voltage.

That is, the spike pulse generation circuit comprising the single silicon device outputs and resets spike pulses at a higher frequency as the magnitude of the input voltage increases.

Figure 6C:
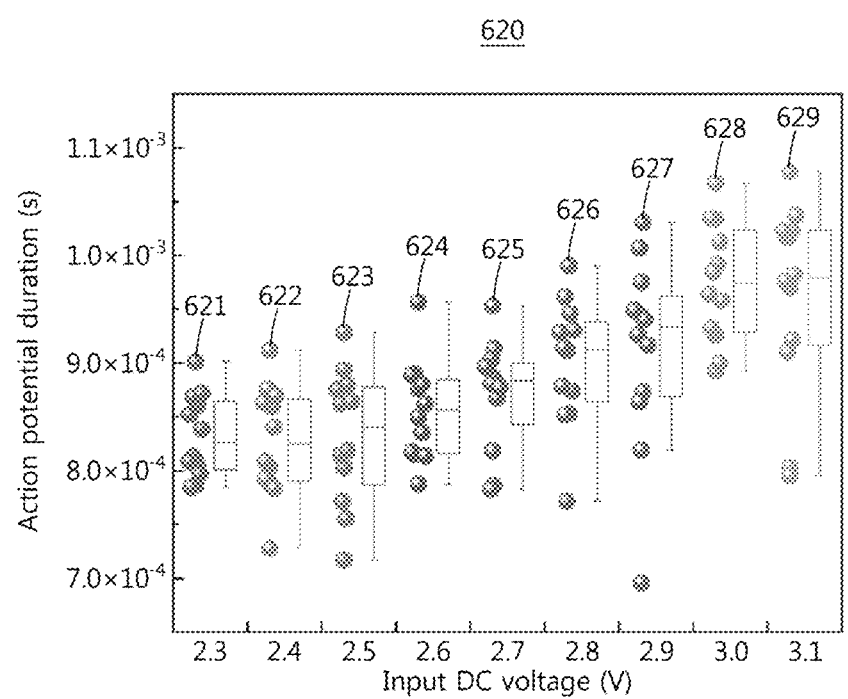

A graph 620 of FIG. 6C illustrates an action potential duration dependent upon an increase in an input voltage.

The graph 620 illustrates Example 621, Example 622, Example 623, Example 624, Example 625, Example 626, Example 627, Example 628, and Example 629 according to the magnitude of voltage.

Examining the action potential durations of Examples 621 to 629, an action potential duration increases with increasing input voltage.

That is, spike pulses are output and reset for a longer action potential duration as the magnitude of the input voltage increases.

Figure 6D:
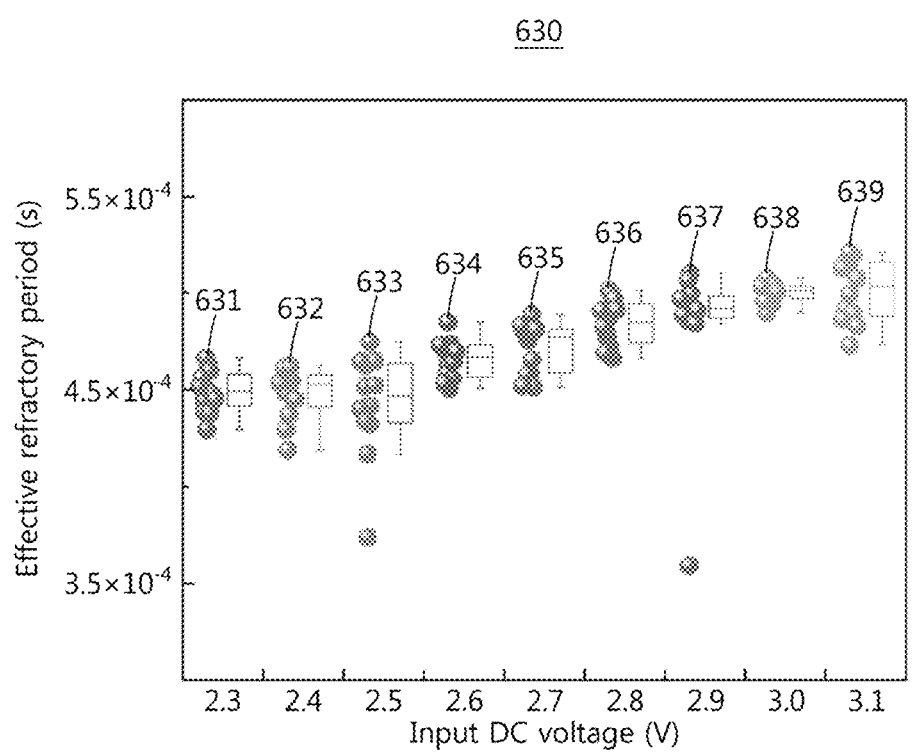

A graph 630 of FIG. 6D illustrates an effective refractory period dependent upon an input voltage increase.

The graph 630 illustrates Example 631, Example 632, Example 633, Example 634, Example 635, Example 636, Example 637, Example 638, and Example 639 according to the magnitude of voltage.

Examining the effective refractory periods of Examples 631 to 639, an effective refractory period increases with increasing input voltage.

That is, spike pulses are output and reset for a longer effective refractory period as the magnitude of the input voltage increases.

In accordance with an embodiment of the present disclosure, the spike pulse generation circuit comprising the single silicon device may perform a neuron operation based on the probabilistic feedback phenomenon due to probabilistic phenomena, such as the tunneling phenomenon and recombination/generation, in the single silicon device.

Accordingly, the spike pulse generation circuit comprising the single silicon device according to an embodiment of the present disclosure may periodically generate spike pulses to operate as a ring oscillator circuit, and may non-periodically generate spike pulses to operate as a neuron-mimicking circuit.

Figure 7:
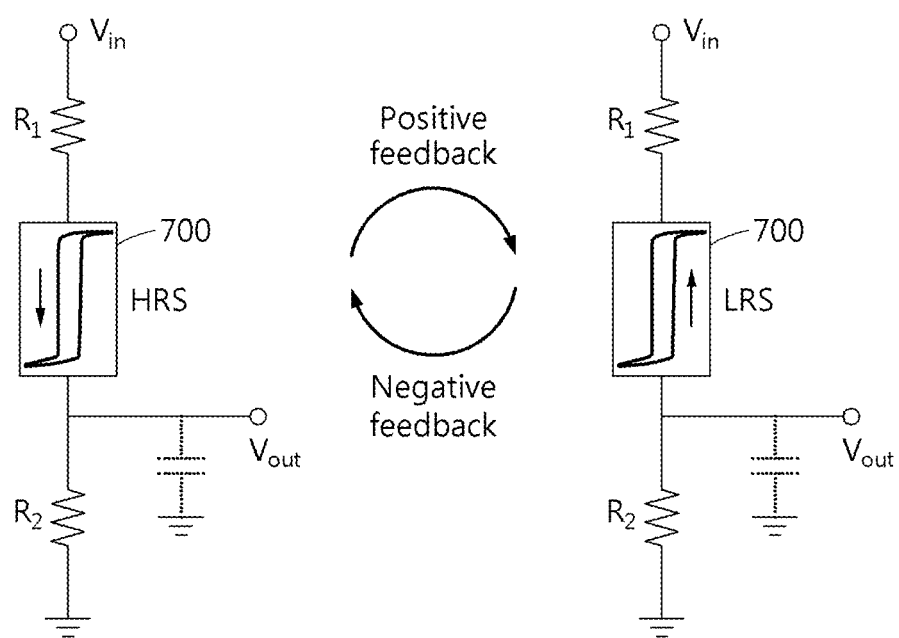
FIG. 7 illustrates a positive feedback loop generation operation and a negative feedback loop trigger operation of a spike pulse generation circuit comprising a single silicon device according to an embodiment of the present disclosure.

FIG. 7 illustrates a positive feedback loop generation operation and a negative feedback loop trigger operation of a spike pulse generation circuit comprising a single silicon device according to an embodiment of the present disclosure.

Referring to FIG. 7, when a positive feedback loop is generated, the state of a single silicon device 700 included in the spike pulse generation circuit may be converted from a High Resistance State (HRS) to a Low Resistance State (LRS). When a negative feedback loop is triggered, the state of a single silicon device 700 may be converted from LRS to HRS.

That is, latch-up and latch-down phenomena may occur in the single silicon device 700 of the spike pulse generation circuit through a feedback operation mechanism of electrons and holes.

The latch-up phenomenon due to a positive feedback loop serves to lower the resistance of the single silicon device 700, and the latch-down phenomenon due to a negative feedback loop serves to increase the resistance of the single silicon device 700.

When an input voltage is applied, latch-up due to a positive feedback loop occurs in the single silicon device 700 included in the spike pulse generation circuit. When a voltage applied to the single silicon device 700 is reduced due to voltage distribution with a resistor, latch-down occurs due to a negative feedback loop.

Accordingly, the spike pulse generation circuit comprising the single silicon device 700 increases a voltage applied to the single silicon device 700, so that the positive feedback loop may be formed again. As this process is repeated, oscillation may occur.

Accordingly, the spike pulse generation circuit comprising the single silicon device may periodically or non-periodically generate spike pulses.

Figure 8:
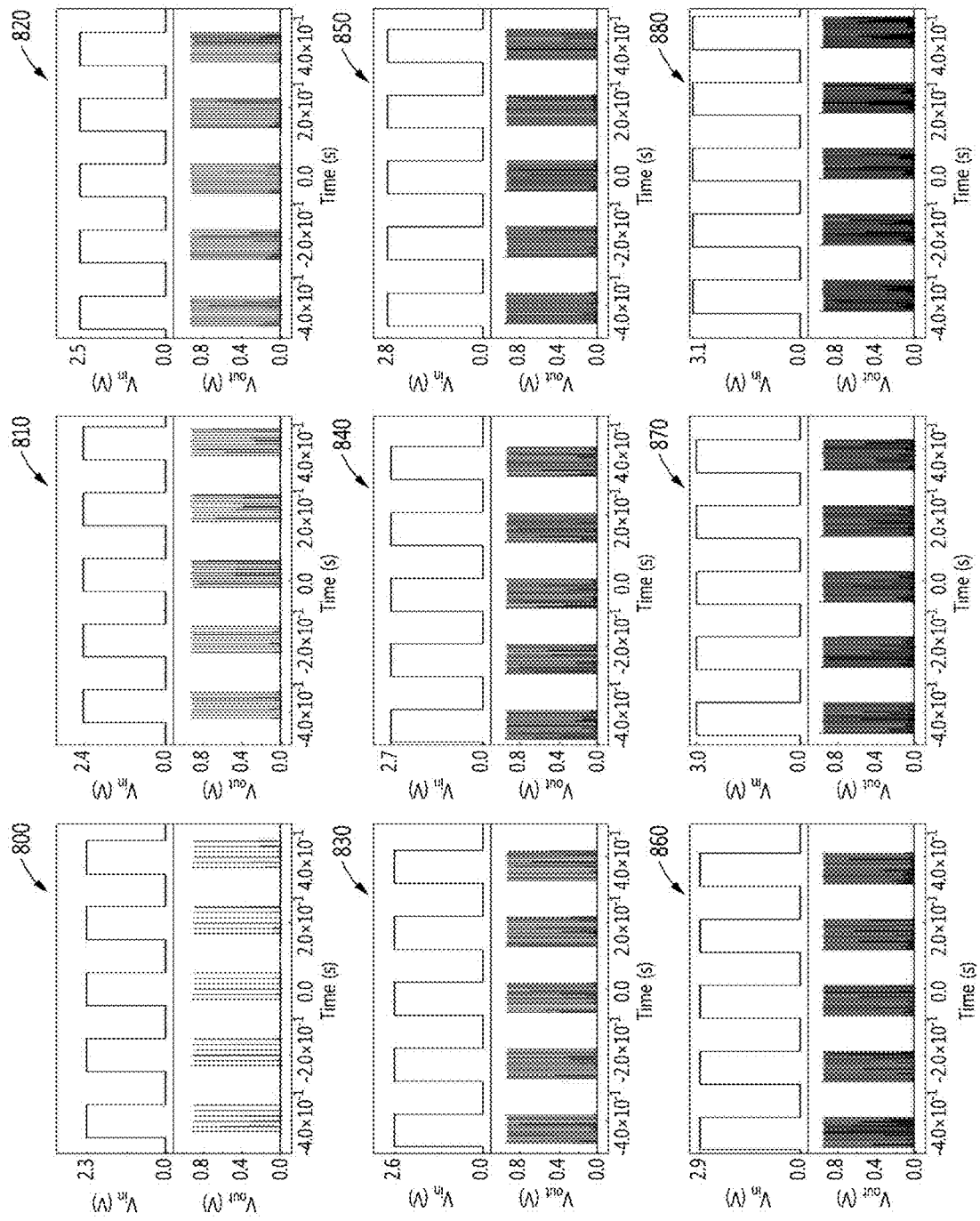
FIGS. 8 and 9 are diagrams for comparing input and output characteristics of a spike pulse generation circuit comprising a single silicon device according to an embodiment of the present disclosure.
Figure 9:
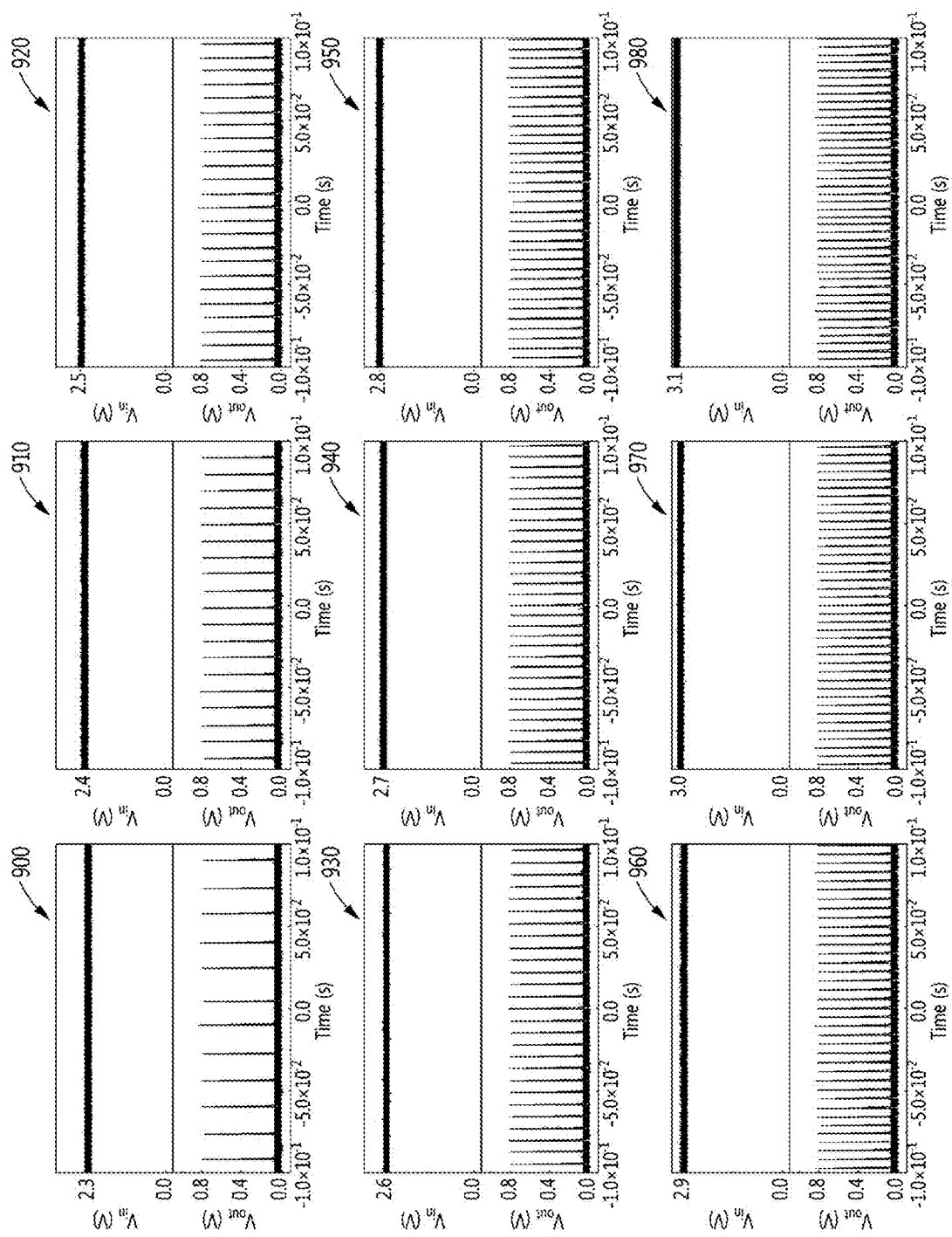

FIGS. 8 and 9 are diagrams for comparing input and output characteristics of a spike pulse generation circuit comprising a single silicon device according to an embodiment of the present disclosure.

Referring to FIG. 8, graphs 800 to 880 illustrate a change in an output voltage when an input voltage is changed while applying the same in the form of a square wave.

An input voltage in graph 800 is 2.3 V, an input voltage in graph 810 is 2.4 V, an input voltage in graph 820 is 2.5 V, an input voltage in graph 830 is 2.6 V, an input voltage in graph 840 is 2.7 V, an input voltage in graph 850 is 2.8 V, an input voltage in graph 860 is 2.9 V, an input voltage in graph 870 is 3.0 V, an input voltage in graph 880 is 3.1 V, and an input voltage in graph 890 is 3.2 V.

Referring to graphs 800 to 890, the interspike interval may be reduced as the input voltage increases from 2.3 V to 3.2 V.

That is, generation and resetting frequencies of the spike pulses may increase as the input voltage increases.

FIG. 9 illustrates oscillation frequency changes dependent upon an input voltage that is applied to a spike pulse generation circuit comprising a single silicon device according to an embodiment of the present disclosure.

Referring to FIG. 9, graphs 900 to 990 illustrate output voltage changes when an input voltage is increased and maintained.

An input voltage in graph 900 is 2.3 V, an input voltage in graph 910 is 2.4 V, an input voltage in graph 920 is 2.5 V, an input voltage in graph 930 is 2.6 V, an input voltage in graph 940 is 2.7 V, an input voltage in graph 950 is 2.8 V, an input voltage in graph 960 is 2.9 V, an input voltage in graph 970 is 3.0 V, an input voltage in graph 980 is 3.1 V, and an input voltage in graph 990 is 3.2 V.

Referring to graphs 900 to 990, the interspike interval may be reduced as the input voltage increases from 2.3 V to 3.2 V.

That is, the generation and resetting frequency of the spike pulses may increase as the input voltage increases.

In addition, in the spike pulse generation circuit comprising the single silicon device, injection of carriers is changed according to the input voltage so that the interaction in forming positive and negative feedback loops is changed, which leads to a change in the oscillation frequency.

That is, the oscillation frequency may increase as the input voltage applied to the spike pulse generation circuit comprising the single silicon device increases.

In other words, in the spike pulse generation circuit comprising the single silicon device, generation intervals of spike pulses may be adjusted according to the magnitude of the applied input voltage.

Accordingly, the spike pulse generation circuit comprising the single silicon device may maintain the same magnitude of the input voltage such that the generation intervals of spike pulses are periodically formed, or may repeatedly change the magnitude of the input voltage such that the generation intervals of spike pulses are non-periodically formed.

Figure 10:
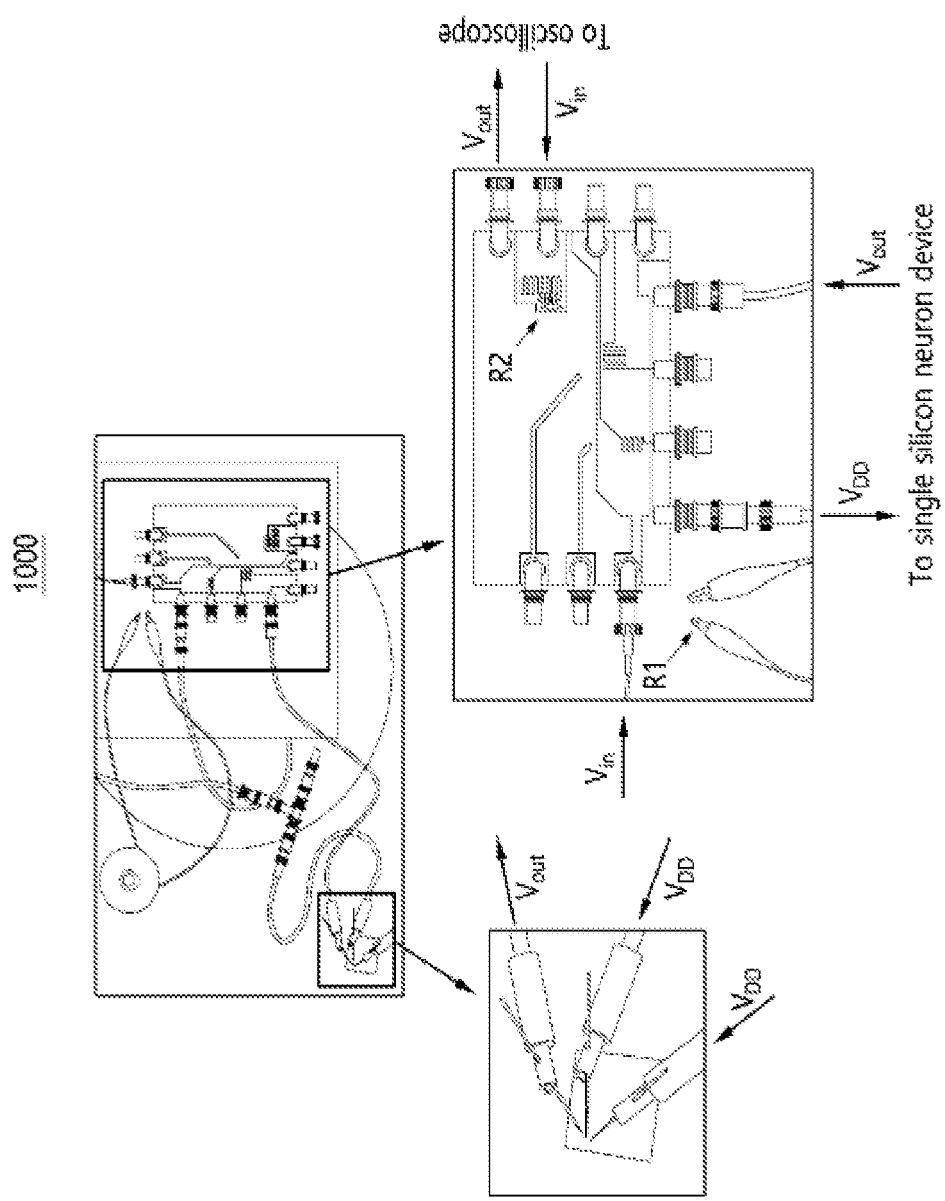
FIG. 10 illustrates a test environment of a spike pulse generation circuit comprising a single silicon device according to an embodiment of the present disclosure.

FIG. 10 illustrates a test environment of a spike pulse generation circuit comprising a single silicon device according to an embodiment of the present disclosure.

Referring to FIG. 10, under a test environment 1000 of the spike pulse generation circuit comprising the single silicon device, the spike pulse generation circuit comprising the single silicon device is connected to output and input terminals of an oscilloscope. The output results of FIGS. 9 and 10 have been derived under this environment.

As apparent from the above description, the present disclosure provides a spike pulse generation circuit capable of selectively generating a spike pulse, particularly capable of non-periodically generating a spike pulse to operate as a neuron-mimicking circuit and periodically generating a spike pulse to operate as a ring oscillator.

The present disclosure can provide a spike pulse generation circuit comprising a single silicon device based on CMOS having oscillatory and stochastic neuronal dynamics.

The present disclosure can provide a spike pulse generation circuit comprising a single silicon device, which can adopt an existing CMOS process, and an oscillator comprising resistors, thereby being capable of improving processing speed and integration limits due to separation of a memory and a processor and performing processing like a human brain.

The present disclosure can provide a spike pulse generation circuit comprising a single silicon device configured to use interconnected positive and negative feedback loops of charge carriers that generate neuronal oscillation similar to a biological neuron.

The present disclosure can provide a spike pulse generation circuit comprising a single silicon device capable of performing neuronal behaviors sensitive to an analog input because a potential well formed in a channel region of the single silicon device serves as a membrane and charge carriers can be continuously stored in the potential well.

The present disclosure can provide a spike pulse generation circuit comprising a single silicon device configured to have two terminals, i.e., input and output terminals, similar to a biological neuron, thereby not requiring an external power supply and a bias input.

The present disclosure can provide a spike pulse generation circuit comprising a single silicon device capable of implementing oscillatory neuronal functionalities and stochastic neuronal functionalities using stochastic feedback switching dynamics.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

The software may include computer programs, code, instructions, or a combination of one or more of the foregoing, configure the processing apparatus to operate as desired, or command the processing apparatus, either independently or collectively. In order to be interpreted by a processing device or to provide instructions or data to a processing device, the software and/or data may be embodied permanently or temporarily in any type of a machine, a component, a physical device, a virtual device, a computer storage medium or device, or a transmission signal wave. The software may be distributed over a networked computer system and stored or executed in a distributed manner. The software and data may be stored in one or more computer-readable recording media.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOLS

100: spike pulse generation circuit
110: single silicon device
111: drain region
112: first channel region
113: second channel region
114: source region
115: gate region

What is claimed is:

1. A spike pulse generation circuit comprising a single silicon device, wherein a positive feedback loop is generated in the single silicon device when a potential generated by an input voltage exceeds; a threshold value, resulting in a selectively generated spike pulse having an initial state, and each of spike pulses corresponding to the generated potential is selectively generated and output according to a generated firing event, and the selectively generated spike pulse is reset; the initial state when a negative feedback loop is triggered in the single silicon device based on the generated firing event.

2. The spike pulse generation circuit comprising the single silicon device according to claim 1, wherein the spike pulse generation circuit integrates the input voltage in a channel region of the single silicon device to generate the potential.

3. The spike pulse generation circuit comprising the single silicon device according to claim 2, wherein the channel region comprises an n-doped first channel region and a p-doped second channel region, and a potential well for accumulating charge carriers is formed in the channel region to integrate the input voltage in the channel region, wherein, when the input voltage is applied, holes are integrated in or recombined with the second channel region.

4. The spike pulse generation circuit comprising the single silicon device according to claim 3, wherein the channel region comprises a potential barrier, and injection of charge carriers is blocked before the potential exceeds the threshold.

5. The spike pulse generation circuit comprising the single silicon device according to claim 4, wherein a height of the potential barrier is lowered as the holes are integrated in the second channel region to generate the positive feedback loop so that the channel region operates the potential barrier to be removed only for a predetermined time.

6. The spike pulse generation circuit comprising the single silicon device according to claim 1, wherein the single silicon device is set to a latch-up state when the positive feedback loop is generated, and is set to a latch-down state when the negative feedback loop is triggered.

7. The spike pulse generation circuit comprising the single silicon device according to claim 6, wherein a voltage of the single silicon device in the latch-up state is reduced due to internal resistance to trigger the negative feedback loop.

8. The spike pulse generation circuit comprising the single silicon device according to claim 7, wherein the single silicon device generates the positive feedback loop when a ratio of a composite resistance comprising the internal resistance in the latch-down state and first and second resistors to a combination of the input voltage and the internal resistance in the latch-down state is equal to or greater than a latch-up voltage.

9. The spike pulse generation circuit comprising the single silicon device according to claim 7, wherein the single silicon device generates the negative feedback loop when a ratio of a composite resistance comprising the internal resistance in the latch-up state and first and second resistors to a combination of the input voltage and the internal resistance in the latch-up state is less than or equal to a latch-down voltage.

10. The spike pulse generation circuit comprising the single silicon device according to claim 1, wherein a magnitude and fire rate of the spike pulse increase as a magnitude of the input voltage increases.

11. The spike pulse generation circuit comprising the single silicon device according to claim 1, wherein an interval between the spike pulses is changed according to a magnitude of the input voltage.

\* \* \* \* \*